(12) United States Patent
Abele

(10) Patent No.: US 8,030,805 B2
(45) Date of Patent: Oct. 4, 2011

(54) MICROSYSTEM COMPRISING A BENDING BEAM AND PROCESS OF MANUFACTURE

(75) Inventor: Nicolas Abele, Paris (FR)

(73) Assignee: STMicroelectronics SA, Montrouge (FR)

( * ) Notice: Subject to any disclaimer, the term of this patent is extended or adjusted under 35 U.S.C. 154(b) by 342 days.

(21) Appl. No.: 12/205,698

(22) Filed: Sep. 5, 2008

(65) Prior Publication Data

US 2009/0066170 A1 Mar. 12, 2009

(30) Foreign Application Priority Data

Sep. 7, 2007 (FR) ..................................... 07 06269

(51) Int. Cl.
*H02K 33/00* (2006.01)
(52) U.S. Cl. ...................... 310/15; 333/186; 331/116 M
(58) Field of Classification Search ................... 310/15, 310/25, 36, 12.05, 12.06; 73/105, 862.59, 73/DIG. 1; 333/186; 335/78; 257/415
See application file for complete search history.

(56) References Cited

U.S. PATENT DOCUMENTS

| | | | | |
|---|---|---|---|---|
| 4,912,990 A | * | 4/1990 | Norling | 73/862.59 |
| 5,339,698 A | * | 8/1994 | Robinson et al. | 73/862.59 |
| 5,946,795 A | * | 9/1999 | Altemir | 29/602.1 |
| 6,311,557 B1 | * | 11/2001 | Davis et al. | 73/514.31 |
| 6,668,627 B2 | * | 12/2003 | Lange et al. | 73/105 |
| 6,707,351 B2 | * | 3/2004 | Gorrell | 333/188 |
| 6,987,435 B2 | * | 1/2006 | Ko et al. | 335/78 |
| 7,102,467 B2 | * | 9/2006 | Lutz et al. | 333/186 |
| 7,397,326 B2 | | 7/2008 | Naito et al. | |
| 2007/0035200 A1 | | 2/2007 | Casset et al. | |
| 2009/0066170 A1 | * | 3/2009 | Abele | 310/25 |

FOREIGN PATENT DOCUMENTS

WO 2006/083482 A2 8/2006

OTHER PUBLICATIONS

Abele et al., "0-Level Vacuum Packaging RT Process for MEMS Resonators," Stresa, Italy: DTIP, Feb. 20, 2008, (4 pages).
Brueckner et al., "Electromechanical Resonances of SiC and A1N Beams under Ambient Conditions," Paris, France: 13th GAAS Symposium, 2005, (pp. 585-588).
Gaspar et al., "Thin-Film Paddle Microresonators with High Quality Factors Fabricated at Temperatures Below 110° C.," 18th IEEE International Conference on Micro Electro Mechanical Systems, Jan. 30-Feb. 3, 2005, (pp. 125-128).
Kádár et al., "Magnetic-field measurements using an integrated resonant magnetic-field sensor," Sensors and Actuators A(70):225-232, 1998.

* cited by examiner

*Primary Examiner* — Karl I Tamai
(74) *Attorney, Agent, or Firm* — Lisa K. Jorgenson; Robert Iannucci; Seed IP Law Group PLLC

(57) ABSTRACT

A mechanical micro system comprising a flexible bending beam extending along a direction, and at least one magnetic element for creating a magnetic field. The flexible beam includes: a first circuit having a first topology for generating, in response to one current flowing through the first circuit, a force having an effect on the beam at one particular place so as to cause a first vibratory mode; a second circuit having a second topology for generating, in response to one current flowing through the second circuit, a force having an effect on the beam at one particular second position so as to cause a second vibratory mode.

26 Claims, 4 Drawing Sheets

MICROSYSTEM COMPRISING A BENDING BEAM AND PROCESS OF MANUFACTURE

BACKGROUND

1. Technical Field

The present invention relates to the field of electronic circuits and more particularly to a mechanical Microsystem comprising a bending beam and a process for manufacturing the same.

2. Description of the Art

Micro Electro Mechanical Systems (M.E.M.S.) have shown for several years a significant development because of their ability to integrate within a single microelectronic circuit a dual electrical and mechanical function.

Different MEMS systems are already known in the art, and particularly microsystems fitted with a bending beam allowing easy manufacturing.

U.S. patent application Ser. No. 11/388,213, which was filed by the Assignee of the present application under priority of FR0502942 filed on Mar. 24, 2005, discloses an example of a micro system comprising a flexible beam, located above one electrode being electromechanically coupled with the beam.

FIG. 1 is a perspective view of such a flexible beam microsystem comprising one substrate 100 having an electrode with an overhanging flexible beam 140 extending along an axis O-y, and which is affixed at its two ends by two anchors 150 located on substrate 100. The flexible beam constitutes a first electrode overhanging above one conductive element 160 located on the substrate and forming a second electrode with which the flexible beam is likely to electrostatically interact.

FIG. 2 illustrates the overhanging beam as it stands without any interaction while FIG. 3 shows the same beam when bent and distorted.

One can thus achieve a set of two electrodes, respectively inferior and superior, the superior electrode forming a resonator with a high quality factor.

Generally speaking, it is desirable to provide different resonance frequencies in one single micro system which comprises a flexible beam, in order to extend the possibilities of use of the MEMS system for the realization of resonators.

In addition, it is desirable to provide an additional micro system which comprises a flexible beam which can be magnetically actuated in a new way.

The following documents are representative of the state of the art in this technical field:

"*Resonator-Based Magnetic Field Sensors*" by Z. Kadar, A. Bossche, P. M. Sarro, J. R. Mollinger, "Magnetic-Field Measurements Using an Integrated Resonant Magnetic-Field Sensor", Sensors and Actuators A, 70, pp 225-232, 1998.

"*Electromechanical Resonances of SiC and AlN Beams Under Ambient Conditions*" by Bruechner K; Forster Ch., Tonisch K., Cimalla V., Ambacher O., Stephan R., Blau K., Hein M. A.

BRIEF SUMMARY

One embodiment is a microsystem comprising a resonator which can be magnetically controlled and easy to manufacture.

One embodiment is a micro system comprising a resonator with several different vibratory modes expanding the possibility of uses of resonators.

One embodiment is a mechanical micro system which comprises a flexible bending beam extending along one direction, and at least one magnetic element for creating a magnetic field.

The flexible beam further includes:
- a first circuit having a first topology for generating, in response to one current flowing through said first circuit, a force having an effect on said beam at one particular place so as to cause a first vibratory mode;
- a second circuit having a second topology for generating, in response to one current flowing through said second circuit, a force having an effect on said beam at one particular second position so as to cause a second vibratory mode.

In one particular embodiment, the micro system is arranged on a silicon substrate and the flexible beam is made of mono-crystal.

In one embodiment, the first circuit forms a current loop extending along the whole length of said beam whereas said second circuit forms a second current loop extending along half the length of said beam.

In one particular embodiment, the first and second circuit are arranged on one horizontal side of said beam, for instance on the top side of the flexible beam.

In one specific embodiment, the beam comprises, on one lateral side,
- a third circuit having a third topology for generating, in response to one current flowing through said third circuit, a force resulting in a third vibratory mode;
- a fourth circuit having a fourth topology for generating, in response to one current flowing through said fourth circuit, a force resulting in a fourth vibratory mode.

Preferably, the third circuit forms a current loop extending along the whole length of the beam whereas the fourth circuit forms a fourth current loop extending along half the length of said beam.

In one particular embodiment, the third and fourth circuits are manufactured by means of successive epitaxial and doping steps. Alternatively, the third and fourth circuits comprise conductive paths made of conductive vias.

One embodiment also provides a process for fabricating a mechanical micro system comprising a flexible bending beam extending along a (O-y) direction, and at least one magnetic element(s) for creating a magnetic field.

The process comprises the successive steps of:
- preparing a silicon substrate comprising at least one magnetic element(s);
- creating STI trenches;
- selective epitaxial growth of a sacrificial layer of Si—Ge;
- non-selective epitaxial growth of a layer of Si in a delimited area determined by said STI trench, and etching of said layer in order to form a flexible beam fixed at its two ends by two anchors and located above said sacrificial layer;
- successive doping and epitaxial operations of said layer in order to perform the deposition of at least a first and a second conductive circuit, each having a specific topology allowing, in cooperation with said magnetic element(s), the generation of a force resulting in one specific vibratory mode;
- removal of said sacrificial layer (SiGe) so as to release said beam and allow its vibration.

BRIEF DESCRIPTION OF THE SEVERAL VIEWS OF THE DRAWINGS

Other features of one or more non-limiting and non-exhaustive embodiments will best be understood by reference to the following detailed description when read in conjunction with the accompanying drawings.

DETAILED DESCRIPTION

Figure 1:
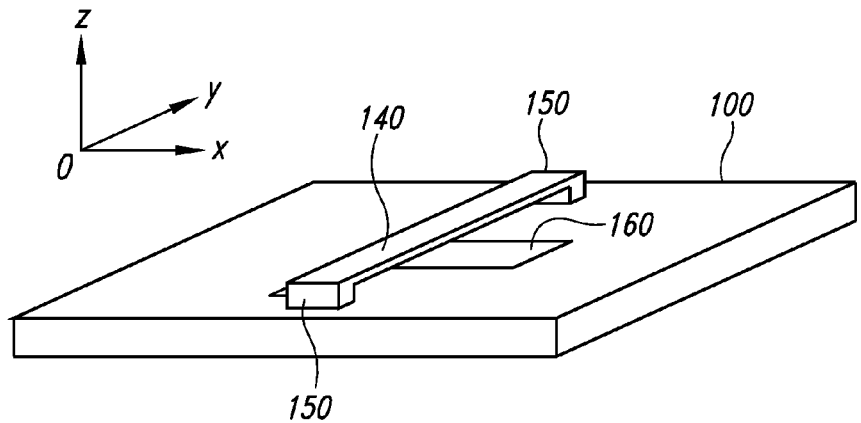
FIG. 1 is a perspective view of a microsystem comprising a flexible bending beam which can be electrostatically actuated FIGS. 2 and 3 respectively illustrate an elevation of the bending beam, in the standing state and in the bent state.
Figure 2:
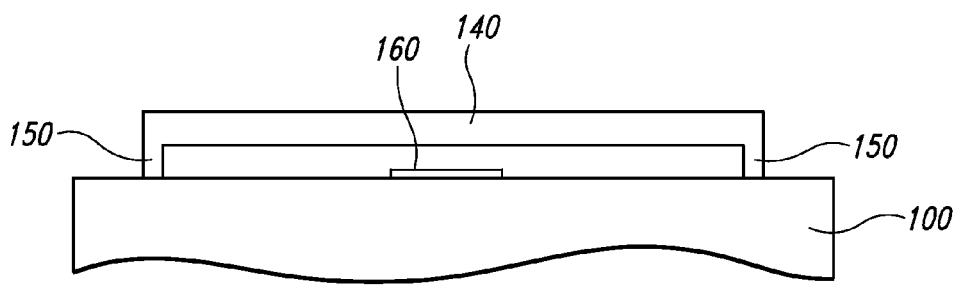
Figure 3:
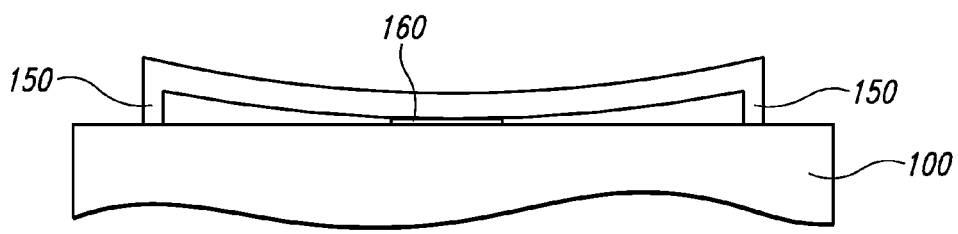
Figure 4A:
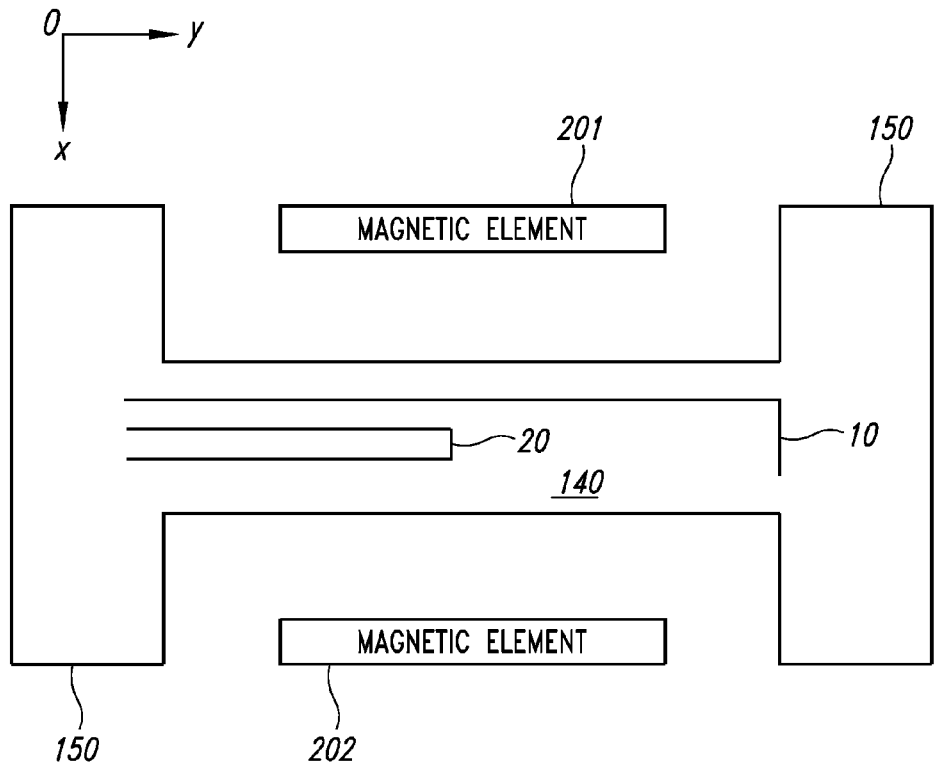
FIG. 4a illustrates one particular embodiment of a micro system comprising a flexible beam which can be actuated by magnetic interaction.

FIG. 4a illustrates a top view of a first embodiment of a micro system which comprises a flexible beam which can be bent by means of a magnetic field. The micro system is composed of a substrate 100, with an overhanging flexible beam 140 affixed at its two ends by two anchors 150 located on Shallow Trench Insulator (STI) structures. The beam extends along one axis O-y. Generally speaking, the beam can be created in several different ways by means of conventional CMOS techniques which are well known by the skilled person. The beam may take a square or rectangular section or even a more sophisticated shape in accordance with the resonance frequency which is desirable to create and the vibratory modes which is wished, as described hereinafter.

The micro system further comprises at least one magnetic element which is located within the close vicinity of the flexible beam and which can magnetically interact with it or any electrical circuit thereon located. In the embodiment which is shown in FIG. 4a, one sees two magnetic elements, respectively 201 and 202, which are located on both sides of the axis of the flexible beam, i.e., the axis O-y and each is capable of producing a magnetic field. The skilled man may consider any other arrangement for producing a magnetic field depending on the particular application being considered.

In the first embodiment which is illustrated in FIG. 4a, the flexible beam comprises at least a first and a second circuit, respectively 10 and 20, in which flows a current in order to embody a current loop. The two circuits show two distinct topological shapes so as to provide a specific interaction with the two magnetic elements 201 and 202 present in the microsystem.

In the embodiment which is illustrated, the first circuit 10 form a current loop extending along the whole length of the flexible beam whereas second circuit 20 forms a loop which only extends along half the length of beam 140.

When in operation, the two circuits 10 and 20 respectively form two different current loops each subject, because of the distinct magnetic interaction with elements 201 and 202, to specific Lorentz forces resulting in a respective vibratory mode.

The creation of two specific vibratory modes for flexible beam 140 results in different characteristic frequencies of the resonator within the micro-system.

More particularly, by arranging an alternating current within circuit loop 10—the "longer" circuit in the considered example—one causes the actuation of the flexible beam in its middle, thus favoring a first vibratory mode and therefore creating a first resonance frequency within the micro system which one can easily measure by means of the other circuit (circuit 20) used as a detection and measuring means of the resonance frequency $f_0$ of the resonator. Such measurement, which can be performed within a filtering circuit based on MEMS type resonators, is already known in the art and will not be further discussed.

Conversely, when one arranges the flowing of one alternating actuation current in circuit 20—the "shorter" circuit in the considered example—one generates a Lorentz force applied to another particular point of flexible beam 140 and, consequently, a second vibratory mode is favored with a second resonance frequency. In this second vibratory mode, circuit 10 can be used for measuring and detection the resonance frequency as, previously, the second circuit was used in a similar way in the first mode of operation discussed above.

One may notice, and this is one advantage of the micro system, that the flexible beam is particularly easy to fabricate with conventional CMOS techniques, for instance with known silicon epitaxial techniques, and that the conductive elements of circuits 10 and 20 will be easily carried out by means of appropriate doping techniques well known by the skilled man.

Figure 4B:
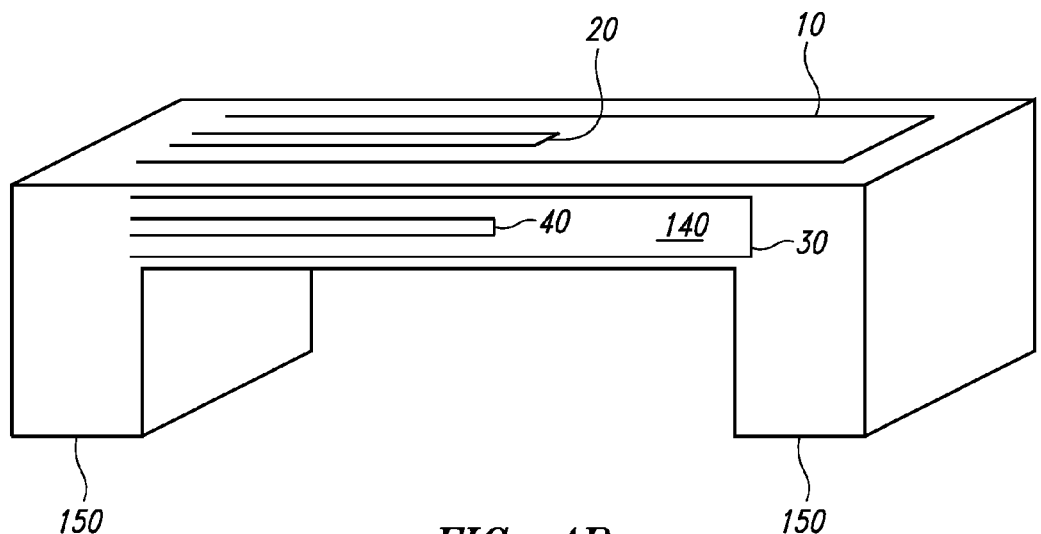
FIG. 4b illustrates another embodiment of a micro system comprising a flexible beam which can be actuated by magnetic interaction.

FIG. 4b illustrates a second embodiment of a micro system which further comprises a third and a fourth circuit, respectively 30 and 40 located on one lateral side of flexible beam 140. One thus provides third and fourth current loops which are arranged in a vertical plane (O, x, z) and which can interact with the magnetic elements 201 and 202.

One may notice that flexible beam 140 is likely to provide a third and a fourth mode of resonance depending on the fact that the beam is being actuated by the flow of a current within third circuit 30 or fourth circuit 40.

A skilled person will clearly vary the arrangement of different circuits on one or more sides of the flexible beam 140 without departing from the scope of the present invention. Other embodiments can be considered wherein, for instance, only circuits 30 and 40 will be present in the micro-system.

One should note that it is very easy, and this by means of a flexible beam which is easy to fabricate by means of well-known Silicon on Nothing (SON) techniques, to select one or more particular harmonics allowing one or more working modes for the resonator.

With such arrangement, it is possible to provide, with only one single MEMS micro system, filtering circuits providing different characterizing frequencies.

There is now described one particular embodiment of a micro system which is illustrated in FIGS. 5a to 5e, based on a semiconductor substrate 100, such as silicon for instance. It should be noticed that the preliminary techniques to be considered for preparing such silicon substrate, and which are well known to the skilled man, will not be further discussed.

Figure 5A:
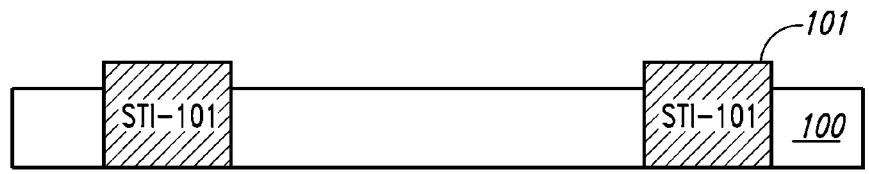
FIGS. 5a to 5e illustrate a first embodiment of the realization of a MOSFET transistor from a conventional substrate.
Figure 5B:
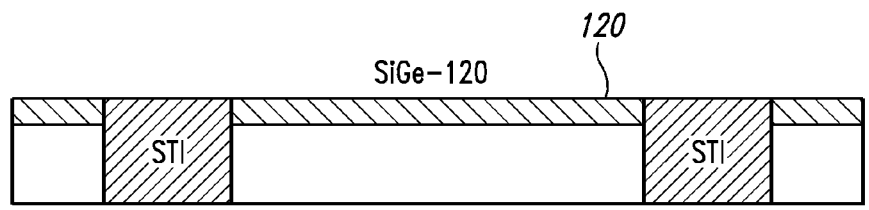

As illustrated in FIG. 5a, the process starts with the preparation of one silicon substrate 100 (designated as "bulk") which is fitted with shallow trench insulators (STI) 101 providing electrical isolation between different electrical structures located on a same substrate. The so-called STI technique is well known to the skilled man and will not be further elaborated. Substrate 100 is, for instance, mono-crystal silicon (Si) which may be covered, as illustrated in FIG. 5b, by a sacrificial layer of SiGe 120. Magnetic elements 201 and 202 (not represented in the figure) can be arranged at this time at the appropriate locations on substrate 100.

Figure 5C:
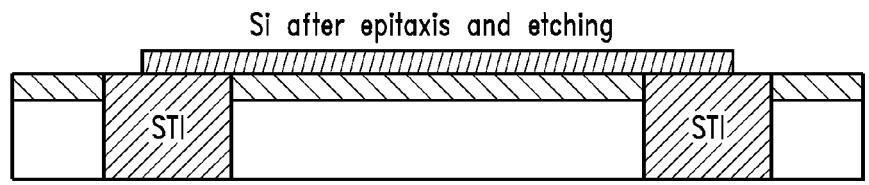

Then, as illustrated in FIG. 5c, one performs a non-selective epitaxial growth of a layer of silicon.

Figure 5D:
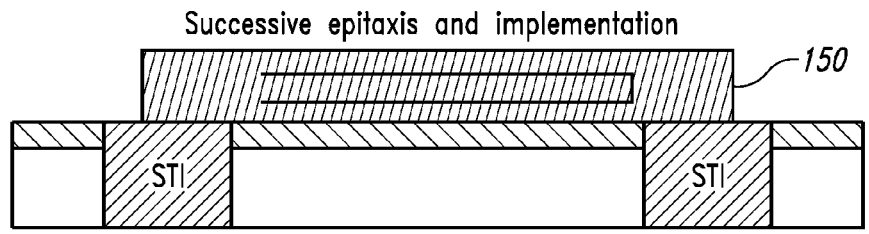

One then performs an epitaxial deposition, as illustrated in FIG. 5d, of a layer of Si which is then etched to the appropriate shape, i.e., that of a flexible beam 140 being fixed at its two ends on two anchors or supporting elements 150 located on the STI structures 101. One will note that successive epitaxial deposition of Si—Ge and Si will naturally result in one monocrystal beam offering the advantage of a high quality factor.

Then, successive doping steps are performed on flexible beam 140 so as to create circuits 10-20 on the top side of the beam.

Figure 5E:
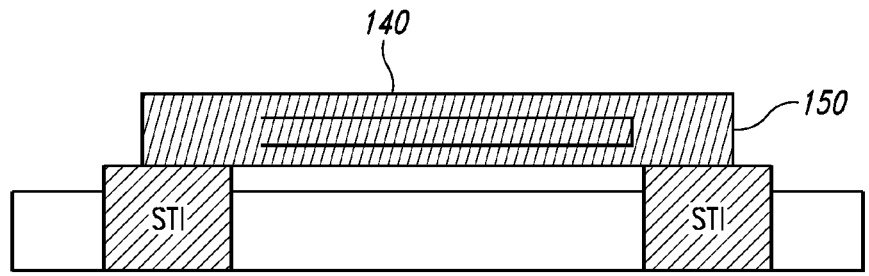

The sacrificial layer 120 is then eliminated in order to release overhanging beam 140, as illustrated in FIG. 5e.

Figure 6:
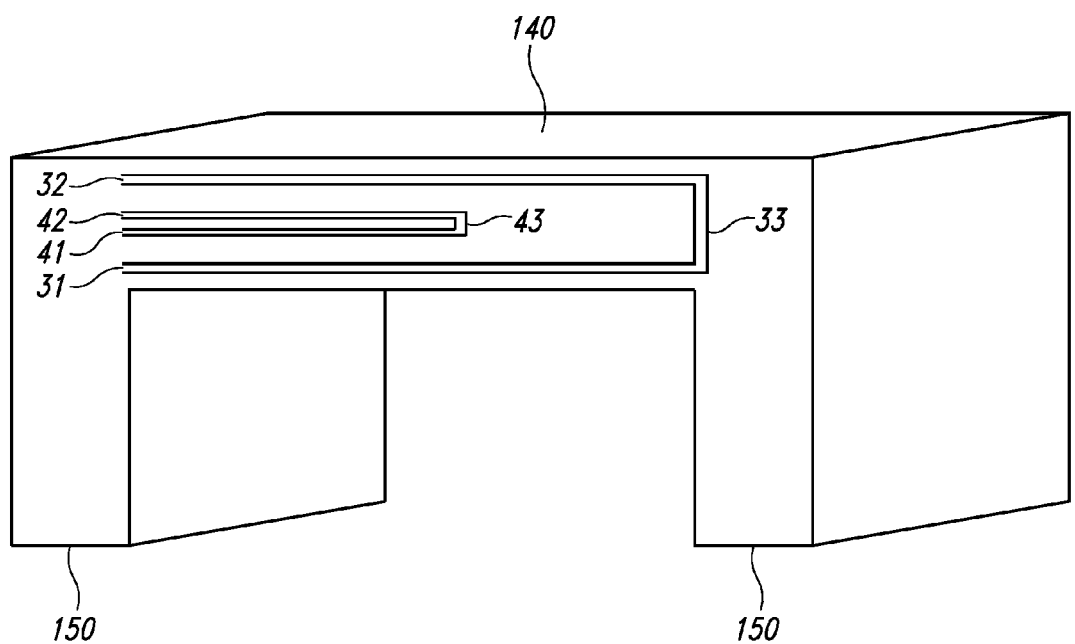
FIG. 6 illustrates the detail of the process of manufacture of the third and fourth circuits located on the lateral side of flexible beam 140.

FIG. 6 more particularly illustrates the doping operation on one lateral side of the beam in order to realize third and fourth circuits 30 and 40.

Circuit 30 comprises, as illustrated in FIG. 6, two horizontal conductive paths, respectively bottom path 31 and top path 32, as well as one vertical conductive path 33.

Similarly, circuit 40 comprises two horizontal conductive paths, respectively bottom path 41 and top path 42, as well as one vertical conductive path 43.

In one particular embodiment, one performs a succession of six epitaxial steps, each being associated with one selective doping, in order to carry out conductive paths 31, 41, 42 and 43, successively.

The interconnection between paths 31 and 32 (respectively path 41 and 42) is achieved by means of a metallic via 33 (respectively 43) in order to complete the fabrication process of circuit 30 (respectively 40).

Alternatively, vertical paths 33 and 43 are carried out by means of in depth doping operations.

When the realization of the beam is completed, including the different actuating and measuring circuits on one or more sides, the sacrificial SiGe layer 120 is removed, as illustrated in FIG. 5d, by means of well known techniques (plasma dry etching), thus releasing beam 140 forming the active functional part of the resonator.

One will notice that the micro system can then be completed by an appropriate packaging in accordance with well known technique.

One example of such a packaging process is disclosed in the following document produced by the inventor and others, i.e., "0-Level Vacuum Packaging RT Process for MEMS Resonators", DTIP 2007, pp. 33-36, by N. Abelé, D. Grogg, C. Hibert, F. Casset, P. Ancey and A.M. Ionescu.

Once fabricated, the micro system is incorporated within an electronic measurement circuit for the purpose of determining the resonance frequency of the flexible beam. Practically, one arranges the dipole formed by the detecting circuit within an oscillation loop which uses any amplifier, and the oscillation of which is measured in order to determine the frequency resonance. Such circuits are well known to a skilled man and, for this reason, will not be further discussed.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A mechanical micro system comprising:
    a magnetic element structured to create a magnetic field; and
    a flexible beam extending along a direction, said beam including:
        a first circuit having a first topology for generating, in response to a current flowing through said first circuit, a force having an effect on said beam at a first position so as to cause a first vibratory mode corresponding to a first resonance frequency; and
        a second circuit having a second topology for generating, in response to a current flowing through said second circuit, a force having an effect on said beam at a second position, distinct from said first position, so as to cause a second vibratory mode corresponding to a second resonance frequency distinct from said first resonance frequency.

2. The mechanical micro system according to claim 1, further comprising a substrate on which the magnetic element and flexible beam are formed, wherein said substrate is silicon and said beam is a mono-crystal formed by epitaxial deposition of silicon.

3. The mechanical micro system according to claim 1 wherein said first circuit forms a current loop extending substantially along the whole length of said beam whereas said second circuit forms a second current loop extending substantially along half the length of said beam.

4. The mechanical micro system according to claim 1 wherein said first and second circuits are arranged on a horizontal side of said beam.

5. The mechanical micro system according to claim 1, comprising, on one lateral side of the beam:
    a third circuit having a third topology for generating, in response to a current flowing through said third circuit, a force resulting in a third vibratory mode; and
    a fourth circuit having a fourth topology for generating, in response to a current flowing through said fourth circuit, a force resulting in a fourth vibratory mode.

6. The mechanical micro system according to claim 5 wherein said third circuit forms a current loop extending substantially along the whole length of said beam whereas said fourth circuit forms a fourth current loop extending substantially along half the length of said beam.

7. The mechanical micro system according to claim 5 wherein said third and fourth circuits are manufactured by successive epitaxial and doping steps.

8. The mechanical micro system according to claim 5 wherein said third and fourth circuits comprise vertical paths made of metallic vias.

9. The mechanical micro system according to claim 1 further comprising means for detecting a resonance frequency of said beam based on the use of said first or said second circuit.

10. The mechanical micro system according to claim 1 wherein the first circuit includes a first current loop having a first size extending along said beam and the second circuit includes a second current loop having a second size, different than the first size, extending along said beam.

11. The mechanical micro system according to claim 1, further comprising a substrate, wherein the beam overhangs the substrate and has two ends anchored on the substrate.

12. A process for fabricating a mechanical micro system, said process comprising:

forming a magnetic element structured to create a magnetic field; and forming a flexible beam extending along a direction, said forming including:

forming a first circuit having a first topology for generating, in response to a current flowing through said first circuit, a force having an effect on said beam at a first position so as to cause a first vibratory mode corresponding to a first resonance frequency; and forming a second circuit having a second topology for generating, in response to a current flowing through said second circuit, a force having an effect on said beam at a second position, distinct from said first position, so as to cause a second vibratory mode corresponding to a second resonance frequency distinct from said first resonance frequency.

13. The process of claim 12, wherein forming the flexible beam includes:

preparing a silicon substrate that includes the magnetic element;
creating STI trenches in the substrate;
epitaxially growing a sacrificial layer of Si—Ge;
epitaxially growing a layer of Si in a delimited area determined by said STI trenches;
etching of said layer of Si in order to form the flexible beam fixed at two ends by two anchors and located above said sacrificial layer;
depositing the first and second circuits by successive doping and epitaxial operations of said layer of Si; and
removing the sacrificial layer.

14. The process of claim 12, wherein the first circuit extends substantially along an entire length of the beam and the second circuit extends only part way along the length of the beam.

15. The process of claim 12, wherein forming the flexible beam further includes:

forming a third circuit having a third topology for generating, in response to a current flowing through said third circuit, a force resulting in a third vibratory mode; and
forming a fourth circuit having a fourth topology for generating, in response to a current flowing through said fourth circuit, a force resulting in a fourth vibratory mode.

16. The process of claim 12, wherein forming the flexible beam includes:

creating STI trenches in a semiconductor substrate;
forming a sacrificial layer on the substrate and between the trenches;
epitaxially growing a beam layer on the sacrificial layer;
etching of said beam layer to form the flexible beam fixed at two ends by two anchors; and
removing the sacrificial layer after forming the first and second circuits in the flexible beam.

17. The process of claim 12 wherein forming the first circuit includes forming the first circuit with a first current loop having a first size extending along said beam and forming the second circuit includes forming the second circuit with a second current loop having a second size, different than the first size, extending along said beam.

18. A device comprising:
a magnetic element structured to create a magnetic field;
a flexible beam adjacent to the magnetic element;
a first circuit extending in the flexible beam along a first length of the flexible beam;
a second circuit extending in the flexible beam along a second length of the flexible beam;
a third circuit having a first topology for generating, in response to a current flowing through said third circuit, a force resulting in a first vibratory mode; and
a fourth circuit having a second topology for generating, in response to a current flowing through said fourth circuit, a force resulting in a second vibratory mode.

19. The device of claim 18, further comprising a silicon substrate on which the magnetic element and flexible beam are formed, wherein said beam is an epitaxial silicon monocrystal.

20. The device of claim 18 wherein said first circuit forms a current loop extending substantially along the whole length of said beam whereas said second circuit forms a second current loop extending substantially along half the length of said beam.

21. The device of claim 18 wherein said third circuit forms a current loop extending substantially along the whole length of said beam whereas said fourth circuit forms a fourth current loop extending substantially along half the length of said beam.

22. The device of claim 18 wherein the first circuit is structured to detect a resonance frequency of said beam as produced said second circuit and the second circuit is structured to detect a resonance frequency of said beam as produced said first circuit.

23. A mechanical micro system comprising:
a magnetic element structured to create a magnetic field; and
a flexible beam extending along a direction, said beam including:
a first circuit having a first topology for generating, in response to a current flowing through said first circuit, a force having an effect on said beam at a first position so as to cause a first vibratory mode;
a second circuit having a second topology for generating, in response to a current flowing through said second circuit, a force having an effect on said beam at a second position so as to cause a second vibratory mode;
a third circuit on a lateral side of the beam and having a third topology for generating, in response to a current flowing through said third circuit, a force resulting in a third vibratory mode; and
a fourth circuit on the lateral side of the beam and having a fourth topology for generating, in response to a current flowing through said fourth circuit, a force resulting in a fourth vibratory mode.

24. The mechanical micro system according to claim 23 wherein said third circuit forms a current loop extending substantially along the whole length of said beam whereas said fourth circuit forms a fourth current loop extending substantially along half the length of said beam.

25. The mechanical micro system according to claim 23 wherein said third and fourth circuits are manufactured by successive epitaxial and doping steps.

26. The mechanical micro system according to claim 23 wherein said third and fourth circuits comprise vertical paths made of metallic vias.

* * * * *